(12) United States Patent
Lee et al.

(10) Patent No.: US 10,770,298 B2
(45) Date of Patent: Sep. 8, 2020

(54) AUTOMATIC INSPECTION DEVICE AND METHOD OF LASER PROCESSING EQUIPMENT

(71) Applicant: EO TECHNICS CO., LTD., Anyang-si, Gyeonggi-do (KR)

(72) Inventors: Hak Yong Lee, Seoul (KR); Sang Young Park, Seoul (KR); Nack Hoon Kim, Anyang-si (KR); Ho Chul Choi, Seoul (KR)

(73) Assignee: EO TECHNICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/757,500

(22) PCT Filed: Aug. 17, 2016

(86) PCT No.: PCT/KR2016/009010
§ 371 (c)(1),
(2) Date: Mar. 5, 2018

(87) PCT Pub. No.: WO2017/069388
PCT Pub. Date: Apr. 27, 2017

(65) Prior Publication Data
US 2018/0247818 A1      Aug. 30, 2018

(30) Foreign Application Priority Data

Oct. 19, 2015    (KR) .................. 10-2015-0145432

(51) Int. Cl.
*H01L 21/268* (2006.01)
*B23K 31/12* (2006.01)
(Continued)

(52) U.S. Cl.
CPC ........ *H01L 21/268* (2013.01); *B23K 26/0006* (2013.01); *B23K 26/032* (2013.01);
(Continued)

(58) Field of Classification Search
CPC ....... H01L 21/268; H01L 22/24; H01L 22/12; H01L 22/30; B23K 26/082; B23K 26/064; B23K 26/362; B23K 26/032
See application file for complete search history.

(56) References Cited

U.S. PATENT DOCUMENTS 8,294,123 B2    10/2012    Nakamae et al.
9,837,315 B2    12/2017    Wakuda et al.
(Continued)

FOREIGN PATENT DOCUMENTS

JP    2008055455 A    3/2008
JP    2009061744 A    3/2009
(Continued)

OTHER PUBLICATIONS

International Search Report (PCT/ISA/210) dated Nov. 16, 2016, by the Korean Patent Office as the International Searching Authority for International Application No. PCT/KR2016/009010.
(Continued)

*Primary Examiner* — Thanh Y. Tran
(74) *Attorney, Agent, or Firm* — Buchanan Ingersoll & Rooney PC

(57) ABSTRACT

Provided is an automatic inspection device and method for inspecting processing quality of laser processing equipment that forms a modified area by irradiating a laser beam into an object to be processed. The automatic inspection device includes: an image film coated on a bottom surface of the object to be processed; an image sensing unit configured to detect a damage image of the object to be processed formed on the image film through irradiation of the laser beam; and an image processing unit configured to process the damage image detected by the image sensing unit.

20 Claims, 9 Drawing Sheets

(51) Int. Cl.
*B23K 26/0622* (2014.01)
*B23K 26/082* (2014.01)
*B23K 26/53* (2014.01)
*H01L 21/66* (2006.01)
*B23K 26/00* (2014.01)
*B23K 26/064* (2014.01)
*B23K 26/03* (2006.01)
*B23K 26/362* (2014.01)
*B23K 26/40* (2014.01)
*B23K 103/00* (2006.01)
*B23K 101/40* (2006.01)

(52) U.S. Cl.
CPC ........ *B23K 26/064* (2015.10); *B23K 26/0622* (2015.10); *B23K 26/0624* (2015.10); *B23K 26/082* (2015.10); *B23K 26/362* (2013.01); *B23K 26/40* (2013.01); *B23K 26/53* (2015.10); *B23K 31/125* (2013.01); *H01L 22/12* (2013.01); *H01L 22/24* (2013.01); *H01L 22/30* (2013.01); *B23K 2101/40* (2018.08); *B23K 2103/50* (2018.08); *B23K 2103/56* (2018.08)

(56) References Cited

U.S. PATENT DOCUMENTS

2009/0141269 A1* 6/2009 Uto .................. G01N 21/21
356/237.2
2017/0229318 A1* 8/2017 Tsunetomo .......... H01L 21/486

FOREIGN PATENT DOCUMENTS

| KR | 1020110094691 A | 8/2011 |
|----|-----------------|--------|
| KR | 1020140140206 A | 12/2014 |
| KR | 1020150065917 A | 6/2015 |

OTHER PUBLICATIONS

Written Opinion (PCT/ISA/237) dated Nov. 16, 2016, by the Korean Patent Office as the International Searching Authority for International Application No. PCT/KR2016/009010.

* cited by examiner

Carbon (500Å)

Cr2O3 (500Å) + Cr (500Å)

AUTOMATIC INSPECTION DEVICE AND METHOD OF LASER PROCESSING EQUIPMENT

TECHNICAL FIELD

The present invention relates to an automatic inspection device and method of laser processing equipment, and more particularly, to a device and method for automatically inspecting whether an object to be processed is damaged by a splash of a laser beam in a device for performing a processing operation by forming a focusing point of the laser beam in the object to be processed.

BACKGROUND ART

A laser processing device irradiates a laser beam emitted from a laser oscillator to an object to be processed by using an optical system, and performs a laser processing operation such as marking, exposure, etching, punching, scribing, or dicing on the object to be processed through irradiation of the laser beam.

Recently, a method of processing an object to be processed by forming a focusing point in the object to be processed through which a laser beam may be transmitted and forming cracks so as to prevent damage to a surface of the object to be processed has been spotlighted. For example, when a high-power laser beam is focused in a semiconductor wafer to form a focusing point, a modified area is formed around the focusing point and cracks are formed from the modified area. Next, when the laser beam moves along a processing line of the semiconductor wafer, a crack row may be formed in the object to be processed, and then the crack row may extend to a surface of the semiconductor wafer naturally or due to an external force, thereby making it possible to cut the semiconductor wafer.

In a laser processing device for performing a processing operation by forming a focusing point in an object to be processed, when a laser beam is incident on a modified area or a crack area formed by the focusing point, the laser beam is splashed around due to interference, thereby damaging the object to be processed. In particular, when the object to be processed is a semiconductor wafer on which elements are integrated and the splashed laser beam affects an active area where the elements are located, a semiconductor chip may be damaged, thereby greatly reducing the yield of the semiconductor chip. Accordingly, it is necessary to automatically inspect and manage the laser processing device so as to early detect damage to the object to be processed due to the splashed laser beam.

DETAILED DESCRIPTION OF THE INVENTION

Technical Problem

According to embodiments, there is provided a device and method for automatically inspecting whether an object to be processed is damaged by a splash of a laser beam in a device for performing a processing operation by forming a focusing point of the laser beam in the object to be processed.

Technical Solution

According to an aspect of the present invention, there is provided an automatic inspection device for inspecting processing quality of laser processing equipment that forms a modified area by irradiating a laser beam into an object to be processed, the automatic inspection device including: an image film coated on a bottom surface of the object to be processed; an image sensing unit configured to detect a damage image of the object to be processed formed on the image film through irradiation of the laser beam; and an image processing unit configured to process the damage image detected by the image sensing unit.

The laser beam may be incident from a top surface of the object to be processed to form the modified area in the object to be processed. The object to be processed may include a semiconductor wafer.

The image film may include a material reactive with the laser beam. The image film may include at least one from among carbon, chromium, and chromium oxide.

The damage image of the object to be processed may be formed when the laser beam is splashed around the modified area and reacts with the image film.

The image sensing unit may be further configured to detect the damage image formed on the image film by using a sensing beam transmitted through the object to be processed. The image sensing unit may include a camera used to align the laser processing equipment and the object to be processed. The image sensing unit may include an infrared (IR) camera.

The image processing unit may be further configured to convert the damage image into a binary image, remove a processing line image from the binary image, and extract position information of damage points indicating points at which the object to be processed is damaged.

According to another aspect of the present invention, there is provided an automatic inspection method for inspecting processing quality of laser processing equipment that forms a modified area by irradiating a laser beam into an object to be processed, the automatic inspection method including: preparing the object to be processed on which an image film is coated; performing a processing operation by irradiating the laser beam into the object to be processed by using the laser processing equipment; detecting a damage image of the object to be processed formed on the image film through irradiation of the laser beam; and processing the damage image of the object to be processed.

The image film may be coated on a bottom surface of the object to be processed, and the laser beam may be incident from a top surface of the object to be processed to form the modified area in the object to be processed. The image film may include a material reactive with the laser beam. The damage image of the object to be processed may be formed when the laser beam is splashed around the modified area and reacts with the image film.

The damage image of the object to be processed formed on the image film may be detected by an image sensing unit. The image sensing unit may be configured to detect the damage image formed on the image film by using a sensing beam transmitted through the object to be processed. The image sensing unit may include a camera used to align the laser processing equipment and the object to be processed.

The damage image of the object to be processed may be processed by an image processing unit.

The processing of the damage image of the object to be processed may include: converting the damage image of the object to be processed detected by the image sensing unit into a binary image; removing a processing line image from the binary image; and extracting position information of damage points indicating points at which the object to be processed is damaged from the binary image from which the processing line image is removed.

The extracting of the position information of the damage points may include: setting a center line on the binary image; and measuring distances between the center line and the damage points and storing the measured distances as data. The automatic inspection method may further include determining the processing quality of the laser processing equipment based on the data.

Advantageous Effects of the Invention

An automatic inspection device according to an example embodiment of the present invention may inspect processing quality of laser processing equipment by automatically performing a process by which an object to be processed is loaded on a stage and then is processed by the laser processing equipment, a process by which an image sensing unit detects a damage image formed on an image film, and a process by which an image processing unit extracts position information of damage points (i.e., distances between a center line and the damage points). Accordingly, a current state of the laser processing equipment may be determined in advance, and thus the laser processing equipment may be easily repaired and managed so as to obtain desired processing quality. Since a camera used to align the laser processing equipment is used as the image sensing unit, the automatic inspection device may be more simply configured. Also, since a damage image of the object to be processed is detected by the image sensing unit in a state where the object to be processed is loaded on the stage without being separated from the stage after a laser processing operation, processing quality of the laser processing equipment may be determined by using a simpler process.

MODE OF THE INVENTION

Figure 1A:
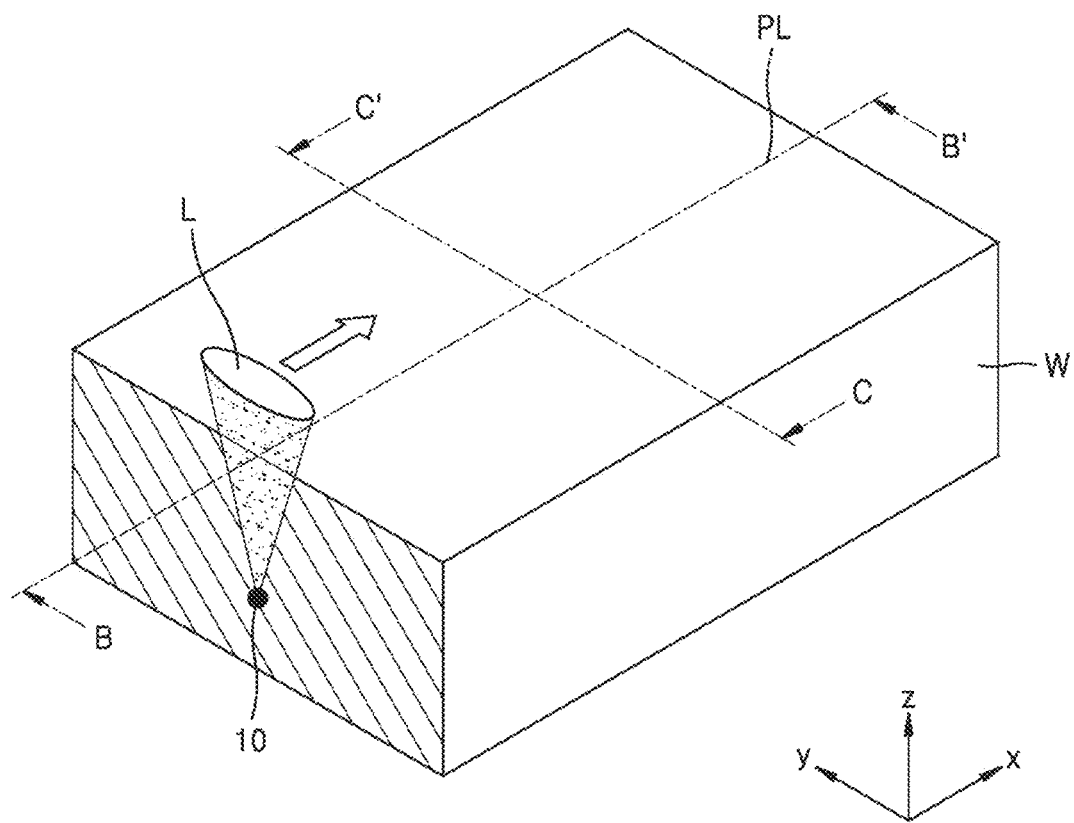
FIG. 1A is a view illustrating a state where a modified area is formed as a laser beam is focused into an object to be processed and moves.

The present invention will be described more fully with reference to the accompanying drawings, in which embodiments are shown. The embodiments may, however, be embodied in many different forms and should not be construed as being limited to the examples set forth herein; rather these embodiments are provided so that this disclosure will be thorough and complete, and will fully convey the present invention to one of ordinary skill in the art. In the drawings, like reference numerals denote like elements, and sizes or thicknesses of elements may be exaggerated for clarity. It will also be understood that when a material layer is referred to as being "on" a substrate, the material layer can be directly on the substrate, or intervening layers may also be present therebetween. A material of each element in the following embodiments is an example, and thus other materials may be used.

FIG. 1A is a view illustrating a state where a modified area 20 (see FIG. 1B) is formed as a laser beam L is focused into an object to be processed W and moves.

Referring to FIG. 1A, the laser beam L emitted from laser processing equipment is focused into the object to be processed W to form a focusing point 10. The laser beam L may be incident into the object to be processed W from a top surface of the object to be processed W. The object to be processed W may be formed of a material through which the laser beam L may be transmitted. For example, the object to be processed W may be, but is not limited to, a semiconductor wafer. A laser having a short pulse width (e.g., a pulse width in picoseconds or nanoseconds) may be used as the laser beam L for forming the focusing point 10 in the object to be processed W.

As such, when the laser beam L is focused into the object to be processed W and the focusing point 10 is formed, the modified area 20 may be formed on and around the focusing point 10, and cracks may be formed by extending outward from the modified area 20. When the laser beam L moves along a processing line PL, the modified area 20 may extend along the processing line PL in the object to be processed W. FIG. 1A illustrates a state where the modified area 20 is formed as the laser beam L moves in an x-direction.

Figure 1B:
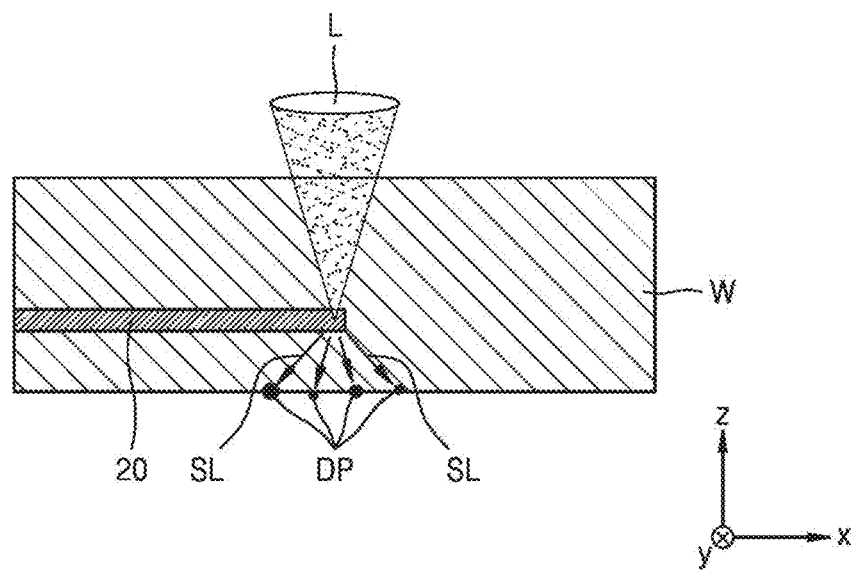
FIGS. 1B and 1C are views illustrating a state where the laser beam is splashed around the modified area in FIG. 1A.
Figure 1C:
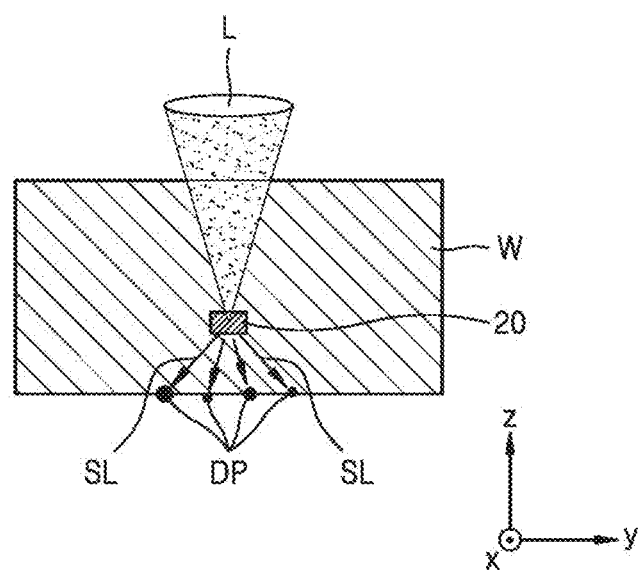

FIGS. 1B and 1C are views illustrating a state where the laser beam L overlaps the modified area 20 and is splashed around the modified area 20 in FIG. 1A. In detail, FIG. 1B is a cross-sectional view taken along line B-B' of FIG. 1A, and FIG. 1C is a cross-sectional view taken along line C-C' of FIG. 1A.

Referring to FIGS. 1B and 1C, when the laser beam L is incident from the top surface of the object to be processed W and meets the modified area 20 formed in the object to be processed W, the laser beam L may be splashed around due to interference. Splashed laser beams SL may travel toward a bottom surface of the object to be processed W and may damage a lower portion of the object to be processed W. Accordingly, damage points DP indicating points at which the object to be processed W is damaged by the splashed laser beams SL may be formed on the bottom surface of the object to be processed W.

FIG. 1B illustrates the damage points DP formed on the bottom surface of the object to be processed W by the laser beams SL splashed in the x-direction or an −x-direction when the laser beam L moves along the processing line PL, that is, in the x-direction. FIG. 1C illustrates the damage points DP formed on the bottom surface of the object to be processed W by the laser beams SL splashed in a y-direction or a −y-direction that is perpendicular to the x-direction when the laser beam L moves along the processing line PL, that is, in the x-direction.

As shown in FIG. 1B, the damage points DP formed when the object to be processed W is damaged by the laser beams SL splashed in a direction (i.e., the x-direction or the −x-direction) parallel to the processing line PL may not greatly affect processing quality when the object to be processed W is cut along the processing line PL. However, as shown in FIG. 1C, the damage points DP formed when the object to be processed W is damaged by the laser beams SL splashed in a direction (i.e., the y-direction or the −y-direction) perpendicular to the processing line PL may adversely affect the processing quality. For example, when the object to be processed W is a semiconductor wafer on which elements are integrated, the laser beams SL splashed in the direction perpendicular to the processing line PL may affect an active area where the elements are located, and in this case, a semiconductor chip may be damaged.

Figure 2A:
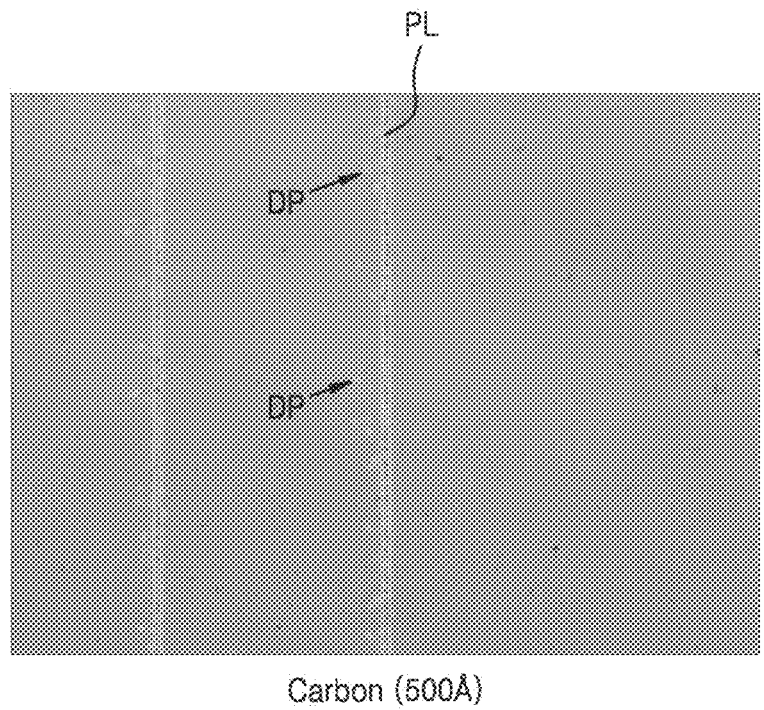
FIGS. 2A and 2B illustrate a damage image of the object to be processed due to a laser splash formed on an image film attached to the object to be processed.
Figure 2B:
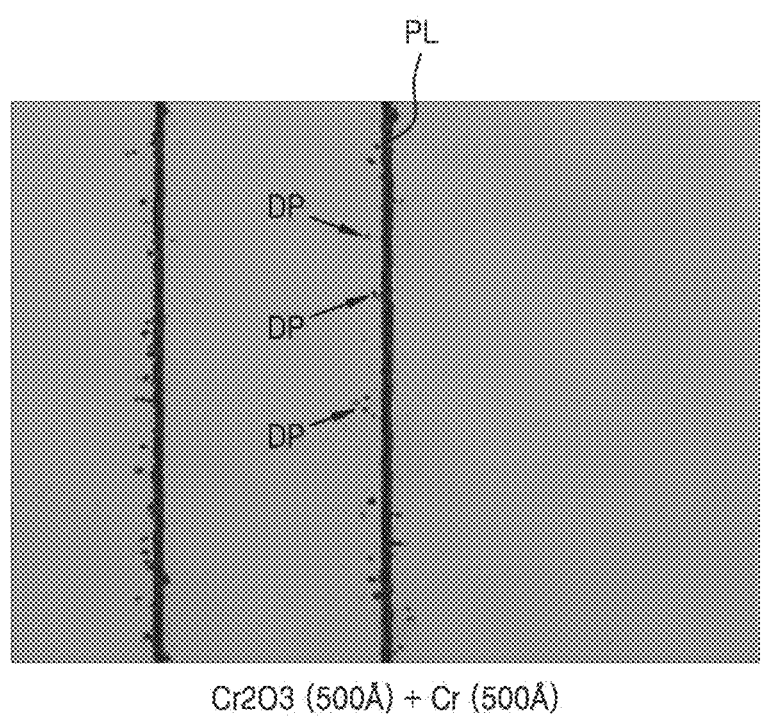

FIGS. 2A and 2B are images of damage points on an image film attached to a bottom surface of a silicon wafer, after a processing operation was performed on the silicon wafer. A laser beam was focused into the silicon wafer from a top surface of the silicon wafer to form a modified area and moved along a processing line, and splashed laser beams formed when the laser beam met the modified area were transmitted through a lower portion of the silicon wafer and reacted with the image film attached to the bottom surface of the silicon wafer to form the damage points on the image film.

In FIG. 2A, an image film formed of carbon with a thickness of 500 Å was attached to the bottom surface of the silicon wafer. In FIG. 2B, an image film formed of chromium oxide with a thickness of 500 Å and chromium with a thickness of 500 Å was attached to the bottom surface of the silicon wafer. As shown in FIGS. 2A and 2B, it is found that an object to be processed was damaged by the splashed laser beams and a plurality of damage points indicating points at which the object to be processed was damaged were formed on a bottom surface of the object to be processed in a direction perpendicular to the processing line.

Figure 3:
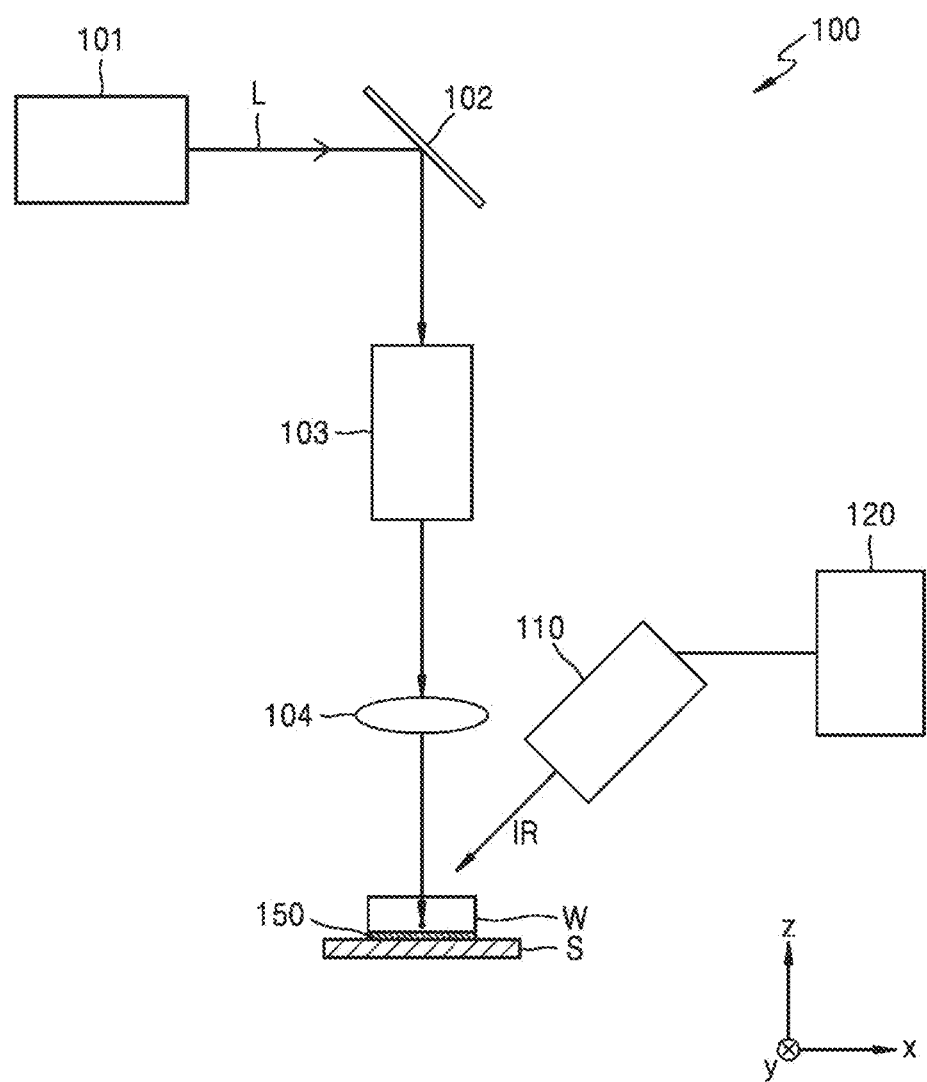
FIG. 3 is a view schematically illustrating an automatic inspection device of laser processing equipment according to an example embodiment of the present invention.
Figure 4:
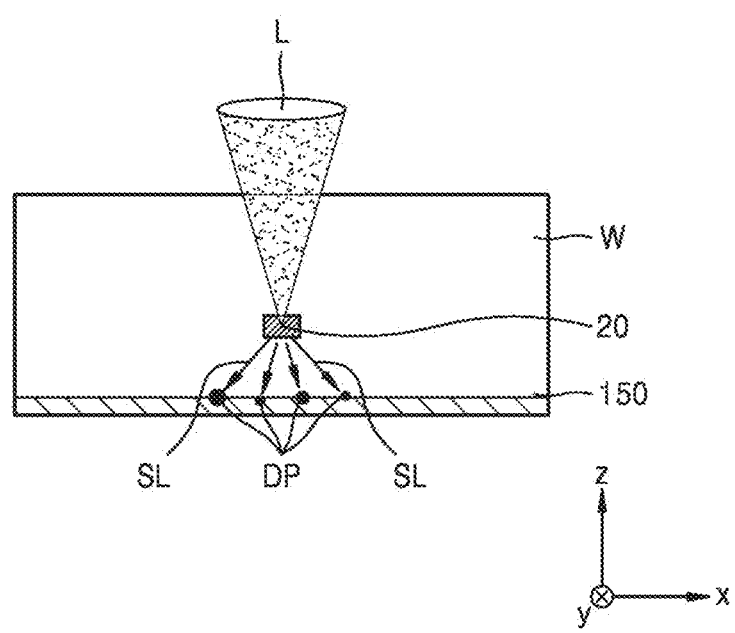
FIG. 4 is a view illustrating the object to be processed and the image film coated on a bottom surface of the object to be processed of FIG. 3.

FIG. 3 is a view schematically illustrating an automatic inspection device 100 of laser processing equipment according to an example embodiment of the present invention. FIG. 3 illustrates the automatic inspection device 100 for inspecting processing quality of the laser processing equipment that forms the modified area 20 by irradiating the laser beam L into the object to be processed W. FIG. 4 illustrates the object to be processed W of FIG. 3 and an image film 150 coated on a bottom surface of the object to be processed W.

Referring to FIGS. 3 and 4, the automatic inspection device 100 may include the image film 150 coated on the bottom surface of the object to be processed W, an image sensing unit 110 configured to detect a damage image formed on the image film 150 by using laser processing, and an image processing unit 120 configured to process the damage image detected by the image sensing unit 110.

In the laser processing equipment for performing a processing operation by irradiating the laser beam L into the object to be processed W, the laser beam L may be emitted from a light source 101, may be reflected by a mirror 102, and then may pass through an optical system 103. The optical system 103 may include, but is not limited to, a beam expanding telescope (BET) and a scan optical system. The laser beam L output from the optical system 103 may be focused by a condensing lens 104 and may be irradiated into the object to be processed W.

The laser beam L may be incident into the object to be processed W from a top surface of the object to be processed W to form a focusing point. The laser beam L may have a short pulse width ranging from, for example, picoseconds to nanoseconds. The object to be processed W may be formed of a material through which the laser beam L may be transmitted. For example, the object to be processed W may include a semiconductor wafer. In this case, elements may be integrated on a bottom surface of the semiconductor wafer. However, this is exemplary, and the object to be processed W may include any of various other materials.

The image film 150 is coated on the bottom surface of the object to be processed W. The image film 150 is used to indicate portions where the object to be processed W is damaged by a laser splash as described below. The image film 150 may be formed of a material reactive with the laser beam L irradiated into the object to be processed W. For example, the image film 150 may include at least one from among carbon, chromium, and chromium oxide. However, this is exemplary, and a material of the image film 150 may be changed in various ways according to a type of the laser beam L.

The image sensing unit 110 is provided around the object to be processed W. The image sensing unit 110 is used to detect a damage image formed on the image film 150 coated on the bottom surface of the object to be processed W by irradiating a sensing beam into the object to be processed W. To this end, the image sensing unit 110 may be a camera for emitting a sensing beam for obtaining the damage image formed on the image film 150 by being transmitted through the object to be processed W. For example, an infrared (IR) camera that emits IR light may be used as the image sensing unit 110. However, this is exemplary, and the image sensing unit 110 may include a camera that emits a sensing beam in any of various wavelength ranges.

In order to clearly obtain the damage image formed on the image film 150, a material of the image film 150 may vary according to a wavelength of the sensing beam emitted from the image sensing unit 110. For example, when the sensing beam emitted from the image sensing unit 110 is IR light, a film formed of chromium and/or chromium oxide, instead of a carbon film, may be used as the image film 150.

In the present embodiment, the image sensing unit 110 may be used as a camera to align the laser processing equipment and the object to be processed W. In this case, the image sensing unit 110 may be used to align the laser processing equipment and the object to be processed W at desired positions and detect the damage image formed on the image film 150 after laser processing.

The image processing unit 120 may process the damage image detected by the image sensing unit 110. In detail, the image processing unit 120 converts the damage image formed on the image film 150 into a binary image, removes a processing line image from the binary image, and then extracts position information of damage points indicating portions where the object to be processed W is damaged.

Figure 5:
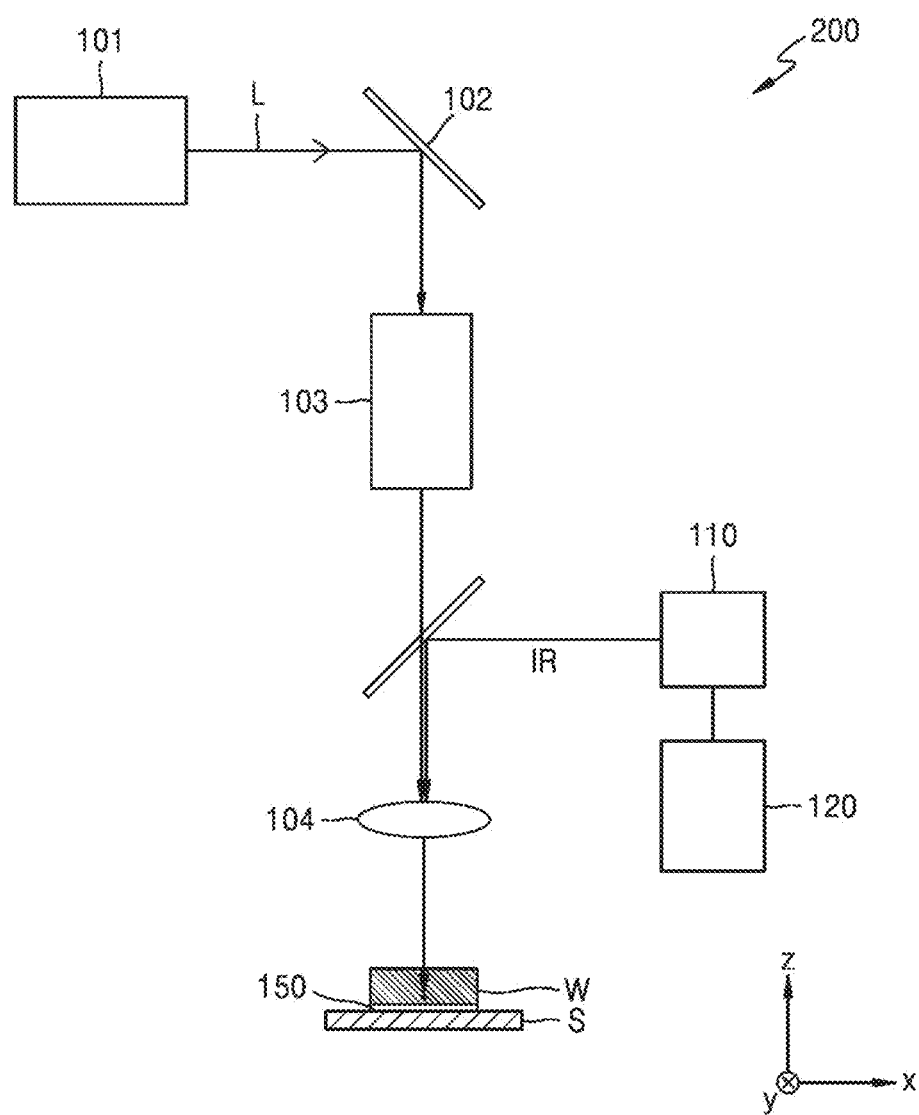
FIG. 5 is a view schematically illustrating an automatic inspection device of laser processing equipment according to another example embodiment of the present invention.

FIG. 5 is a view schematically illustrating an automatic inspection device 200 of laser processing equipment according to another example embodiment of the present invention. The automatic inspection device 200 of FIG. 5 has the same configuration as that of the automatic inspection device 100 of FIG. 3 except that a sensing beam (e.g., IR light) emitted from the image sensing unit 110 is reflected by a dichroic mirror and then is irradiated into the object to be processed W along a path through which the laser beam L travels.

A method of automatically inspecting processing quality of laser processing equipment by using any of the automatic inspection devices 100 and 200 of the laser processing equipment of FIGS. 3 and 5 will now be described.

The object to be processed W on which the image film 150 is coated is loaded on a stage S. The image film 150 may be coated on a bottom surface of the object to be processed W. The object to be processed W may be, but is not limited to, a silicon wafer having a bottom surface on which elements are integrated.

Next, a processing operation is performed on the object to be processed W by using laser processing equipment. In detail, the laser beam L emitted from the laser processing equipment is irradiated from a top surface of the object to be processed W, and is focused into the object to be processed W to form a focusing point. As such, when the focusing point is formed in the object to be processed W, the modified area 20 may be formed on and around the focusing point, and cracks may be formed by extending outward from the modified area 20. When the laser beam L moves along the processing line PL, the modified area 20 may extend along the processing line PL in the object to be processed W.

When the laser beam L irradiated into the object to be processed W overlaps the modified area 20 during a processing operation, the laser beam L may be splashed around the modified area 20 due to interference, and the splashed laser beams SL may travel toward the bottom surface of the object to be processed W and may damage a lower portion of the object to be processed W. Accordingly, the damage points DP indicating points at which the object to be processed W is damaged by the splashed laser beams SL may be formed on the bottom surface of the object to be processed W. FIG. 4 illustrates the damage points DP formed on the image film 150 when the laser beam L moves in a y-direction to perform a processing operation and the splashed laser beams SL are splashed in a direction perpendicular to the y-direction.

Figure 6A:
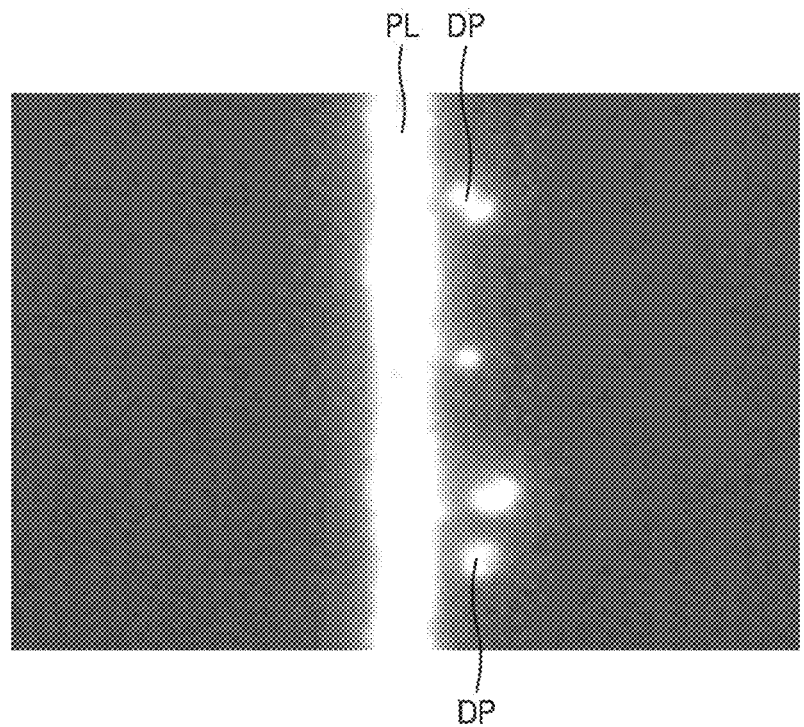
FIGS. 6A through 6D are views illustrating a process by which an image processing unit of the automatic inspection device processes the damage image of the object to be processed formed on the image film.

Next, the image sensing unit 110 detects a damage image of the object to be processed W formed on the image film 150 coated on the bottom surface of the object to be processed W during a laser processing operation. The damage image formed on the image film 150 is formed when the laser beams SL splashed by the modified area 20 in the object to be processed W are output from the bottom surface of the object to be processed W and react with the image film 150 during the laser processing operation. Accordingly, a damaged state of the bottom surface of the object to be processed W by the splashed laser beams SL may be determined from the damage image formed on the image film 150. FIG. 6A illustrates an example of the damage image of the image film 150 detected by the image sensing unit 110.

Next, the image processing unit 120 processes the damage image detected by the image sensing unit 110. The image processing unit 120 converts the damage image formed on the image film 150 into a binary image, removes a processing line image from the binary image, and extracts position information of the damage points DP indicating portions where the object to be processed W is damaged.

A specific process performed by the image processing unit 120 to process the damage image of the object to be processed W detected by the image sensing unit 110 will now be described with reference to FIGS. 6A through 6D. A result shown in FIGS. 6A through 6D was obtained by using a silicon wafer as the object to be processed W and a film formed of chromium and chromium oxide as the image film 150. A wavelength and a pulse width of the laser beam L were respectively 1083 nm and 350 ns.

FIG. 6A illustrates a damage image of the image film 150 obtained by the image sensing unit 110 (e.g., an IR camera). FIG. 6A illustrates a processing line image showing a state where the laser beam L moves along the processing line PL and the damage points DP formed by the laser beams SL splashed around the processing line PL.

Figure 6B:
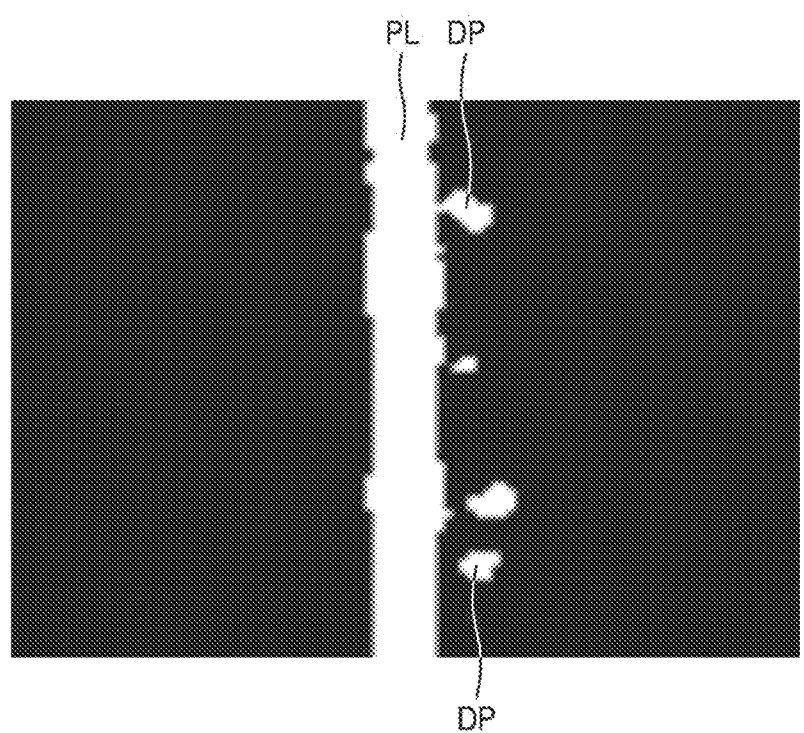

First, the image processing unit 120 converts a damage image of the object to be processed W detected by the image sensing unit 110 into a binary image. The binary image refers to an image representing the damage image with two brightness values. FIG. 6B illustrates a state where the damage image of the object to be processed W of FIG. 6A is converted into the binary image.

Figure 6C:
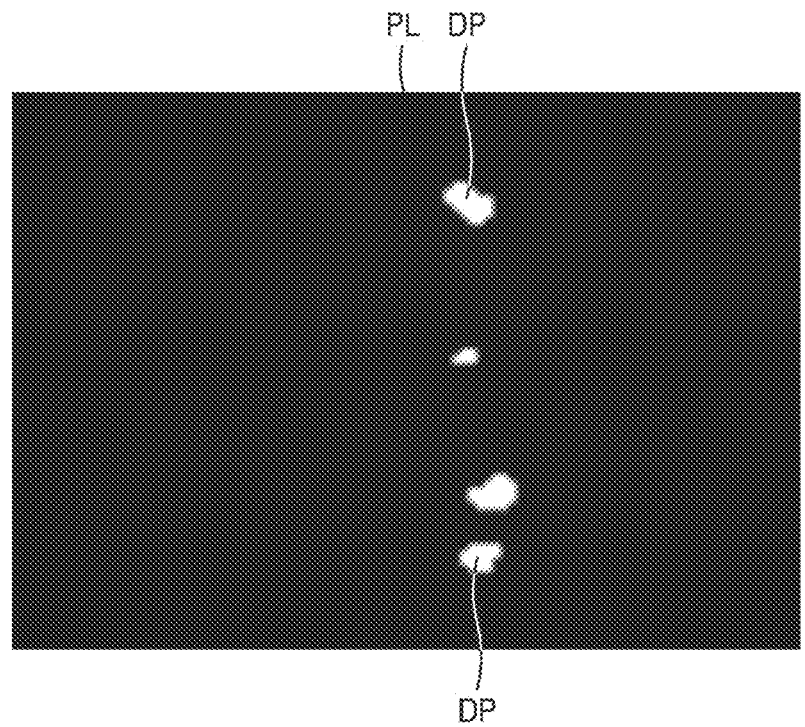

Next, the image processing unit 110 removes the processing line image showing that the laser beam L moves along the processing line PL from the binary image. FIG. 6C illustrates a state where the processing line image is removed from the binary image of FIG. 6B.

Figure 6D:
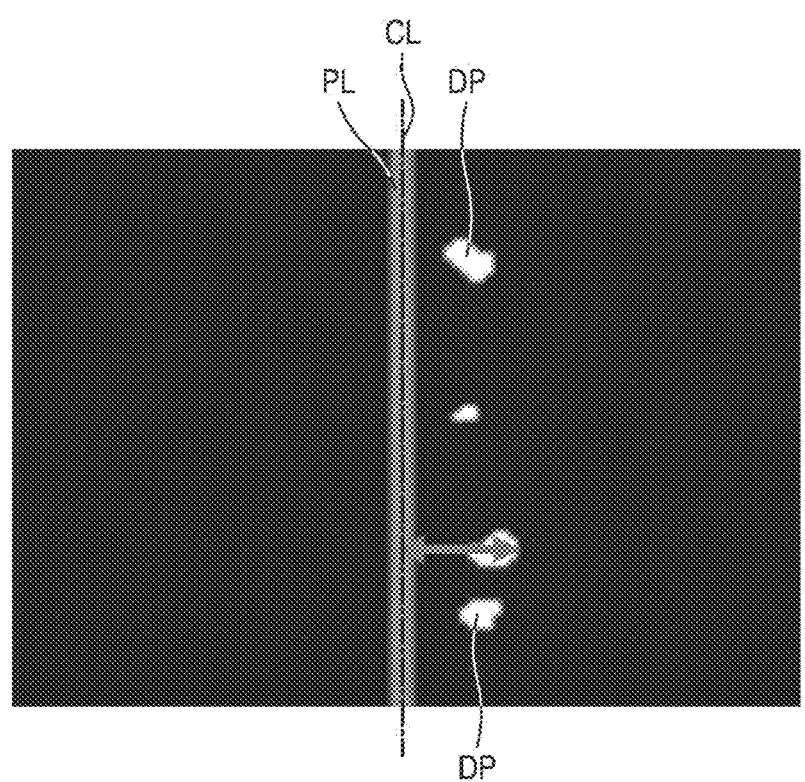

Next, the image processing unit 120 extracts position information of the damage points DP indicating points at which the object to be processed W is damaged when the processing line image is removed. To this end, the image processing unit 120 sets a center line CL on the binary image from which the processing line image is removed, and then measures distances of the damage points DP from the center line CL. FIG. 6D illustrates a state where the center line CL is set on the binary image from which the processing line image is removed.

Figure 7:
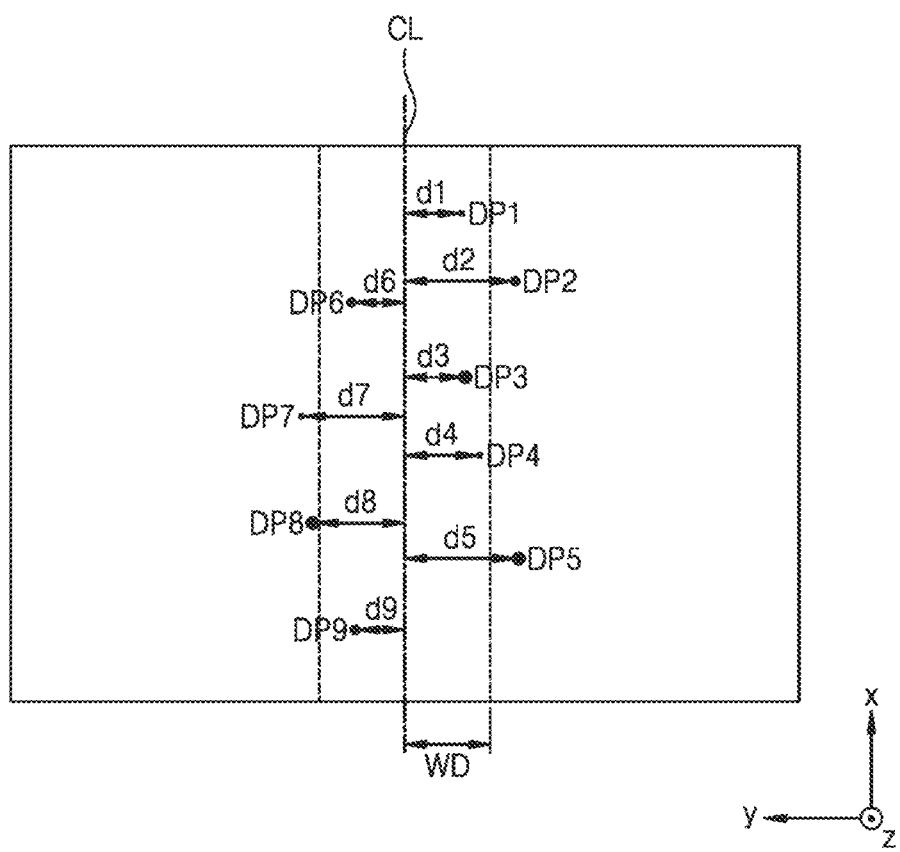
FIG. 7 is a view illustrating a method of extracting position information of damage points on the image film.

A method of extracting position information of damage points will now be described in more detail with reference to FIG. 7. FIG. 7 is a view illustrating a method of extracting position information of damage points DP1 through DP9 on the image film 150.

Referring to FIG. 7, the center line CL is set on a binary image when a processing line image is removed. The center line CL may be set along a center line of the processing line PL. The damage points DP1 through DP9 indicating points at which the object to be processed W is damaged are formed around the center line CL. FIG. 7 exemplarily illustrates nine damage points DP1 through DP9.

After the center line CL is set in this manner, distances d1 through d9 between the center line CL and the damage points DP1 through DP9 are measured. The measured distances d1 through d9 are stored as data.

As described above, all of the distances d1 through d9 between the center line CL and the damage points DP are measured and stored as data, and then processing quality of laser processing equipment is determined based on the data. In FIG. 7, WD denotes a processing width in which damage is tolerable in a processing operation. Accordingly, the damage points DP1, DP3, DP4, DP6, and DP9 located inside the processing width WD may be removed during processing, and thus may not affect processing quality of the laser processing equipment. However, the damage points DP2, DP5, DP7, and DP8 located outside the processing width WD may affect an active area of a semiconductor wafer on which elements are integrated, thereby affecting the processing quality of the laser processing equipment. Accordingly, the processing quality of the laser processing equipment may be automatically determined by extracting position information of the damage points DP1 through DP9, that is, distances between the center line CL and the damage pints DP1 through DP9, by using the image sensing unit 120.

As such, the automatic inspection device 100 or 200 according to the present embodiment may inspect processing quality of laser processing equipment by automatically performing all of a process by which the object to be processed W is loaded on the stage S and then is processed by the laser processing equipment, a process by which the image sensing unit 110 detects a damage image formed on the image film 150, and a process by which the image processing unit 120 extracts position information of the damage points DP (i.e., distances between a center line and the damage points DP). Accordingly, a current state of the laser processing equipment may be determined in advance, and the laser processing equipment may be easily repaired and managed so as to obtain desired processing quality. Since a camera used to align the laser processing equipment is used as the image sensing unit 110, the automatic inspection device 100 or 200 may be more simply configured. Also, since the image sensing unit 110 detects the damage image of the object to be processed W in a state where the object to be processed W is loaded on the stage S without being separated from the stage S after a laser processing operation, the processing quality of the laser processing equipment may be determined in a simpler process. While one or more embodiments of the present invention have been described with reference to the figures, it will be understood by one of ordinary skill in the art that various changes in form and details may be made therein without departing from the spirit and scope as defined by the following claims.

The invention claimed is:

1. An automatic inspection method for inspecting processing quality of laser processing equipment that forms a modified area by irradiating a laser beam into an object to be processed, the automatic inspection method comprising:
preparing the object to be processed on which an image film is coated;
performing a processing operation by irradiating the laser beam into the object to be processed by using the laser processing equipment;
detecting a damage image of the object to be processed formed on the image film through irradiation of the laser beam; and
processing the damage image of the object to be processed.

2. The automatic inspection method of claim 1, wherein the image film is coated on a bottom surface of the object to be processed, and the laser beam is incident from a top surface of the object to be processed to form the modified area in the object to be processed.

3. The automatic inspection method of claim 1, wherein the image film comprises a material reactive with the laser beam.

4. The automatic inspection method of claim 3, wherein the damage image of the object to be processed is formed when the laser beam is splashed around the modified area and reacts with the image film.

5. The automatic inspection method of claim 1, wherein the damage image of the object to be processed formed on the image film is detected by an image sensing unit.

6. The automatic inspection method of claim 5, wherein the image sensing unit is configured to detect the damage image formed on the image film by using a sensing beam transmitted through the object to be processed.

7. The automatic inspection method of claim 5, wherein the image sensing unit comprises a camera used to align the laser processing equipment and the object to be processed.

8. The automatic inspection method of claim 5, wherein the damage image of the object to be processed is processed by an image processing unit.

9. An automatic inspection method for inspecting processing quality of laser processing equipment that forms a modified area by irradiating a laser beam into an object to be processed, the automatic inspection method comprising:
preparing the object to be processed on which an image film is coated;
performing a processing operation by irradiating the laser beam into the object to be processed by using the laser processing equipment;
detecting a damage image of the object to be processed formed on the image film through irradiation of the laser beam; and
processing the damage image of the object to be processed,
wherein the damage image of the object to be processed is processed by an image processing unit, and
wherein the processing of the damage image of the object to be processed comprises:
converting the damage image of the object to be processed detected by the image sensing unit into a binary image;
removing a processing line image from the binary image; and
extracting position information of damage points indicating points at which the object to be processed is damaged from the binary image from which the processing line image is removed.

10. The automatic inspection method of claim 9, wherein the extracting of the position information of the damage points comprises:
setting a center line on the binary image; and
measuring distances between the center line and the damage points and storing the measured distances as data.

11. The semiconductor processing method of claim 10, further comprising determining the processing quality of the laser processing equipment based on the data.

12. A semiconductor processing method for laser processing equipment, the method comprising:
preparing the object to be processed on which an image film is coated;
performing a processing operation by irradiating the laser beam into one side of the object to be processed to form a modified area therein by using the laser processing equipment;
detecting an image of damage to an opposing side surface of the object to be processed, the image formed on the image film by the irradiation of the laser beam; and
processing the image of damage to the object to be processed.

13. The semiconductor processing method of claim 12, wherein the image film is coated on a bottom surface of the object to be processed, and the laser beam is incident from a top surface of the object to be processed to form the modified area in the object to be processed.

14. The semiconductor processing method of claim 12, wherein the image film comprises a material reactive with the laser beam.

15. The automatic inspection method of claim 14, wherein the image of damage to the object to be processed is formed when the laser beam is splashed around the modified area and reacts with the image film.

16. The semiconductor processing method of claim 12, wherein the image of damage to the object to be processed formed on the image film is detected by an image sensing unit.

17. The semiconductor processing method of claim 16, further comprising transmitting a sensing beam through the object to be processed, wherein the image sensing unit is configured to detect the damage image formed on the image film by using the sensing beam transmitted through the object to be processed.

18. The semiconductor processing method of claim 16, wherein the processing the image of damage of the object to be processed is processed by an image processing unit, further comprising:

converting the damage image of the object to be processed detected by the image sensing unit into a binary image;

removing a processing line image from the binary image; and extracting position information of damage points indicating points at which the object to be processed is damaged from the binary image from which the processing line image is removed.

19. The semiconductor processing method of claim 18, wherein the extracting of the position information of the damage points comprises:

setting a center line on the binary image; and measuring distances between the center line and the damage points and storing the measured distances as data.

20. The semiconductor processing method of claim 19, further comprising determining the processing quality of the laser processing equipment based on the data.

* * * * *